United States Patent [19]

Nossen

[11] Patent Number: 4,612,669
[45] Date of Patent: Sep. 16, 1986

[54] ANTENNA MATCHING SYSTEM

[75] Inventor: Edward J. Nossen, Cherry Hill, N.J.

[73] Assignee: RCA Corporation, Princeton, N.J.

[21] Appl. No.: 729,164

[22] Filed: Apr. 30, 1985

[51] Int. Cl.⁴ ...................... H04B 1/02; H03G 11/04
[52] U.S. Cl. .................................. 455/123; 455/129;
 455/284; 333/17 M; 343/861
[58] Field of Search ............... 455/121, 123, 117, 129,
 455/283, 284, 296; 343/852, 861; 333/17 M

[56] References Cited

U.S. PATENT DOCUMENTS 3,160,832 12/1964 Beitman ............................. 455/123
3,160,833 12/1964 Ludvigson et al. .
3,355,667 11/1967 Bruene .
4,201,960 5/1980 Skutta et al. .
4,297,641 10/1981 Sterzer .
4,485,360 11/1984 Seward ........................... 333/17 M
4,493,112 1/1985 Bruene ................................ 455/123

OTHER PUBLICATIONS

"Adaptive Noise Cancelling: Principles and Applications" by: Woodrow et al., Proceedings of the IEEE, vol. 63, #12, Dec. 1975, pp. 1692–1716.

Primary Examiner—Jin F. Ng

Attorney, Agent, or Firm—Joseph S. Tripoli; Robert L. Troike; Robert Ochis

[57] ABSTRACT

A system for adjusting the antenna matching network of a radio system in the presence of an interfering signal in the matching network being adjusted comprises a loop from which the interfering signal is cancelled by an adaptive interference cancellation (AIC) system. The AIC system receives an interference sensor signal having the frequency of the interfering signal. Means responsive to the interference sensor signal and phase and amplitude control signals provides a modified interference sensor signal having a phase and amplitude determined by the control signals. This modified interference sensor signal is combined with a mismatch signal which is derived from the signal in the matching network to produce a modified mismatch signal. An adaptive interference cancellation processor is responsive to the modified mismatch signal for providing the phase and amplitude control signals of values to reduce the amplitude of the interfering signal frequency in the modified mismatch signal relative to its amplitude in the mismatch signal. An adjustment processor responds to the modified mismatch signal to control an impedance adjuster for adjusting the impedance of the matching network.

7 Claims, 7 Drawing Figures

ANTENNA MATCHING SYSTEM

BACKGROUND OF THE INVENTION

The present invention relates to systems for matching an antenna to a radio at a carrier frequency and more particularly to systems for sensing and adjusting antenna matching in the presence of interfering signals.

Many aircraft radios include an adjustable, tuned, antenna coupling network for maximizing the signal coupled to the antenna. When it is desired to change the operating frequency of the radio, both the radio and the antenna coupler must be retuned.

The radio is retuned by changing the carrier frequency on which the radio transmits or receives. If the radio uses a tunable oscillator to generate the transmission carrier frequency, then the radio's transmission frequency is changed to a new frequency by changing the frequency of this oscillator. This has been done by mechanically changing the resonant frequency of a tuned capacitor/inductor (L/C) circuit which includes at least one capacitor or inductor whose value can be varied mechanically. Some newer radios use frequency synthesizers to generate their transmission carrier frequency. If a radio's synthesizer produces a single frequency at a time, then the synthesizer is commanded to begin producing the desired new transmission frequency in place of the old one. If the synthesizer is one which produces many frequencies simultaneously, then the frequency in use is changed. The reception carrier frequency of the radio is changed by changing the local oscillator frequency which controls what range of RF frequencies are down-converted to within the receiver's intermediate frequency (IF) bandwidth. The modulation is detected or demodulated to provide a baseband (or audio) signal. The operating RF carrier frequency is adjusted to the same frequency for both transmission and reception. This retuning of the radio RF carrier frequency in either the reception or transmission mode does not change the tuning of either the antenna or the antenna coupler by which the radio is connected to its antenna.

Where a tuned antenna coupler is included in the radio system, that coupler must be retuned separately from the changing of the radio's operating RF frequency if signals having the maximum available power are to be transmitted and received. The purpose of the tuned antenna coupler is to match the impedance of the antenna to that of the radio at the carrier frequency which is in use. This minimizes reflections and standing waves and maximizes the percentage of the available power which is transmitted or received. The process of retuning the coupler is often referred to as tuning the coupler's tuning network. This specification will refer to the antenna coupler as an antenna matching network and to the process of retuning it as adjusting its impedance in order to avoid confusion with the radio's system for controlling its operating frequency.

One system for adjusting the impedance of an antenna matching network comprises a feedback loop including that matching network, means for adjusting the impedance of that matching network, a sensor for providing a mismatch signal representative of the degree of mismatch of that matching network at the operating frequency during transmission and a matching adjustment processor responsive to the mismatch signal for controlling the means for adjusting the impedance of the matcing network.

In an aircraft having two such radio systems which operate in the same general frequency band, such as the 2–30 MHz RF band, there is a problem of interference between the different radio systems. This interference is a result of coupling between the antennas of the two radios. The matching network of the first radio cannot be adjusted while the second radio is transmitting or adjusting its coupler because of the presence of an excess signal in the first radio's matching network at the frequency of operation of the second radio. In the past, this problem has been avoided by using the radios alternately rather than simultaneously. A need has now developed to be able to use both radio systems at the same time.

It is desirable to have an antenna matching network adjustment system which can adjust the matching network of its radio independent of the operational use of other radios.

SUMMARY

The present invention provides such a matching network adjustment system by selectively including an adaptive interference cancellation (AIC) system within a matching network adjustment system feedback loop which also includes the antenna matching network, a matching network adjuster, a mismatch sensing system and a matching adjustment processor. This AIC system receives as input signals a mismatch signal from the mismatch sensing system and an interference sensor signal. The AIC system includes means responsive to the interference sensor signal and amplitude and phase control signals for providing a modified interference sensor signal having a phase and amplitude determined by the control signals, means for combining the modified interference sensor signal having a phase and amplitude determined by the control signals, means for combining the modified interference sensor signal with the mismatch signal to provide a modified mismatch signal and an adaptive interference cancellation processing system responsive to the modified mismatch signal for providing the phase and amplitude control signals of values that reduce the amplitude of the interfering signal in the modified mismatch signal relative to its amplitude in the mismatch signal and means for coupling the modified mismatch signal to the adjustment processor.

DESCRIPTION OF PREFERRED EMBODIMENT

Figure 1:
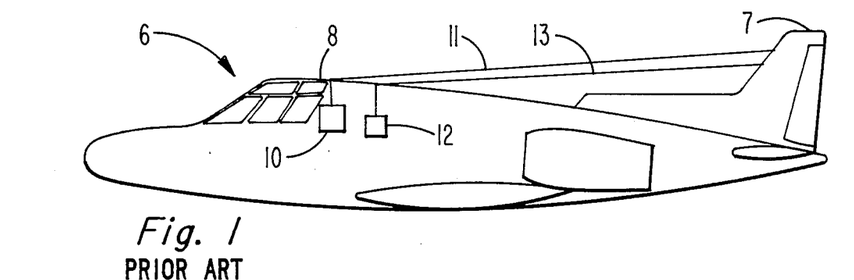
FIG. 1 is a schematic illustration of an aircraft having two complete radio systems each with its own antenna.

In FIG. 1 an aircraft 6 has a first radio system 10 having an antenna 11 and a second radio system 12 having an antenna 13. The antennas 11 and 13 are in the form of separate wires extending from near the top of the vertical stabilizer 7 to the top of the fuselage 8.

Each of the radio systems 10 and 12 includes a tuneable antenna matching network and an antenna matching network adjustment system. A prior art antenna matching network adjustment 20 is illustrated in block diagram form in FIG. 2. This matching network adjustment system includes an inductor/capacitor (L/C) coupler tuning or matching network 21, a mismatch sensing system 22, a matching adjustment processor 23 and an impedance adjuster 24. Matching networks 21 have for years comprised mechanically tunable capacitors and or inductors. More recently the use of electronically switched capacitors and inductors has become common in some applications. The mismatch sensing system 22 employs probes positioned where the current through them or the voltage across them will vary with the degree of mismatch of the matching network 21 at the transmission frequency. In the case of a mechanically adjusted matching network 21, the impedance adjuster 24 is a reversible motor drive whose rotation increases or decreases the value of the adjustable capacitors or inductors in accordance with its direction of tuning. In the case of an electrically switched matching network, the impedance adjuster 24 is a switching system which switches capacitors and inductors into and out of the active matching network in a manner to change the impedance of the matching network in a prescribed manner. The matching adjustment processor can be any of a large variety and has the characteristic of sensing whether the mismatch signal is greater than a threshold value and whether it is increasing or decreasing with the adjustment of the matching network. When the mismatch signal reaches a minimum value or passes below the threshold value, the processor stops the matching adjustment process and provides a "matching network adjusted" signal to its radio system. The connected terminal points 27 and 28 in the conductor from the mismatch sensing system 22 to the input of a matching adjustment processor 23 will be referred to subsequently during the discussion of the present invention which improves on this prior art adjustment system. The antenna matching network 21 is coupled between the transmitter 25 and the antenna 11 of a radio system such as 10. Within the transmitter 25 there is a carrier frequency exciter 26 which generates the carrier operating frequency of the radio.

Figure 2:
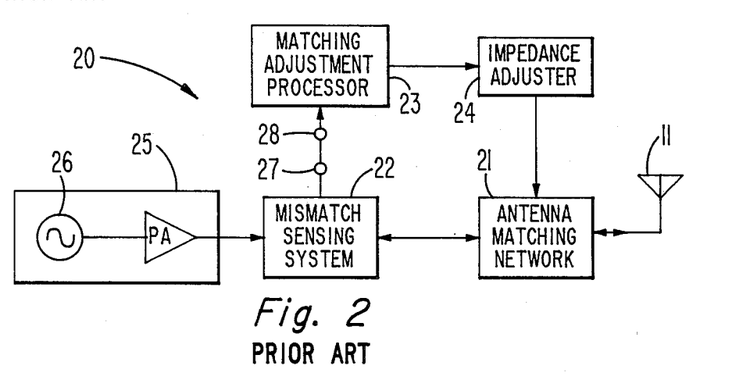
FIG. 2 is a block diagram of a prior art antenna matching network adjustment system.

Both of the radios 10 and 12 normally operate for example at a transmission power of 1,000 watts in the 2-30 MHz radio band. When one of the radios has been operating at a given frequency and it is desired to change its operating frequency, it is retuned while the other radio is not transmitting. The radio being retuned has its power output reduced to about 100 watts as a protective measure because large amplitude reflections and standing waves can arise during the process of adjusting the matching network 21. The frequency provided by the exciter 26 of the radio being retuned is then switched to the new operating frequency $F_O$ where the subscript "0" refers to the fact that this is the radio's own frequency. A tuning signal is transmitted at a power of about 100 watts through matching network 21 to that radio's antenna 11 or 13. Because the matching network 21 is initially not adjusted to this new transmission frequency $F_O$, reflections and standing waves produce larger than desirable voltages and currents within the transmission path between the transmitter and the antenna. These high signal levels are reflected in the mismatch signal produced by the mismatch sensing system 22. The matching adjustment processor 23 in response to these relatively large mismatch signals and the change in transmission frequency, commands the impedance adjuster 24 to change the impedance of the matching network 21. As the impedance of the network 21 changes, the mismatch signal also changes. The matching adjustment processor 23 determines whether impedance adjustment is in the proper direction and when the matching network 21 is adequately matched by monitoring the amplitude of the mismatch signal. The ampliutde of this signal decreases as the impedance match of network 21 improves because both reflections and standing waves decrease as an impedance match is approached. When the matching adjustment processor determines that the adjustment of matching network 21 has brought the sensed mismatch below a set threshold, the adjustment process stops and the matching adjustment processor provides a signal to the radio system indicating that the matching network is now adjusted. The radio is then returned to normal operation, either high power (1,000 watts) operation if transmission at the new frequency is desired or to the receiving mode if reception is desired on the new frequency.

There is substantial coupling between the antennas 11 and 13 because of their close, substantially parallel orientation as shown in FIG. 1. This coupling is often on the order of about 10dB. Thus, when radio 12 transmits at a power of 1,000 watts, the antenna of radio 10 picks that signal up at a power of about 100 watts. As a result, if radio 12 were transmitting during the retuning of radio 10, the matching network of radio 10 would have two comparable signals passing therethrough, one of about 100 watts at its own transmission frequency $F_O$ coming from its transmitter and one of about 100 watts at the transmission frequency $F_I$ of radio 12 received by the antenna 11 of radio 10. The subscript "I" on $F_I$ indicates that this is the interfering frequency. This interference problem exists across the full common operating band of these radios because each matching network is tunable across the associated radio's entire operating frequency range which may range from 2 MHz to 30 MHz. As a result, the amplitude of the mismatch signal can not decrease to a "properly adjusted" level and the matching adjustment processor 23 is unable to determine whether the matching network is properly adjusted.

Figure 3:
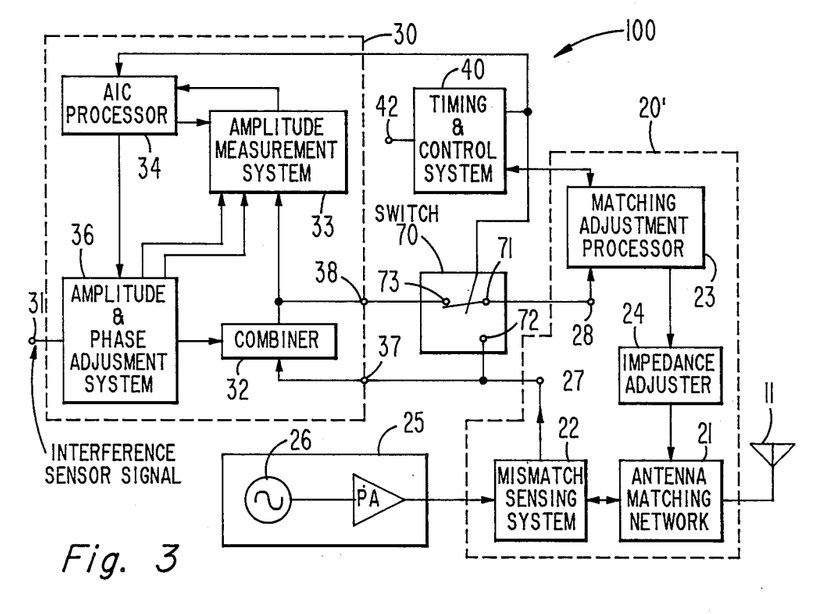
FIG. 3 is a block diagram of an antenna matching network adjustment system in accordance with the present invention.

An improved matching network adjustment system 100 in accordance with the present invention which overcomes this problem is illustrated in block diagram form in FIG. 3. The improved matching network adjustment system 100 comprises a modified prior art adjustment system 20' with the addition of an adaptive interference cancellation (AIC) system 30, a timing and control system 40 and a switch 70.

The AIC system 30 adds to the mismatch signal a modified interference sensor signal which has the same amplitude and is 180° out-of-phase with the component of the mismatch signal which is at the frequency $F_I$ of the interference sensor signal. This addition may be done in a resistive combiner, a 3dB hybrid or another power combiner circuit as may be considered desirable. Because the component of the mismatch signal at the interference sensor signal frequency is of the same amplitude and 180° out-of-phase with the modified interference sensor signal, these two signals cancel each other in the power combiner and the modified mismatch signal is substantially free of components at the interference sensor signal frequency. The AIC system is coupled to the prior art system 20' by replacing the short circuit across terminals 27 and 28 in FIG. 2 with a single pole, double throw switch 70. Switch 70 has its common terminal 71 connected to terminal 28, one branch terminal 72 connected to terminal 27 and to a first input terminal 37 of AIC system 30. The other branch terminal 73 of switch 70 is connected to the output terminal 38 of AIC system 30.

Adaptive interference cancellation (AIC) system 30 in this embodiment includes a power combiner 32, an amplitude measurement system 33, an AIC processor 34 and an amplitude and phase weighting or adjustment system 36. The first input terminal 37 of AIC system 30 is connected to the terminal point 27 within adjustment loop 20' to receive the mismatch signal provided by mismatch sensing system 22. This input is coupled as a first input to the power combiner 32. A second input terminal 31 of the AIC system is connected to receive an interference sensor signal which is preferably obtained directly from the carrier frequency exciter of the transmitter of the other radio. This interference sensor signal is connected as a first input to the amplitude and phase adjustment system 36. Both of these input signals—the mismatch signal and the interference sensor signal—are low level signals which are easily processed using only low power circuitry.

The output from the amplitude and phase adjustment system 36 is connected as a second input to the power combiner 32. The amplitude and phase adjustment system 36 operates under the control of signals provided by the AIC processor 34 in order to provide its output signal (the modified interference sensor signal) with an amplitude and phase which when combined in combiner 32 with the mismatch signal will substantially cancel the portion of the mismatch signal which is at the frequency of the interference sensor signal.

The output of the power combiner 32 is a modified mismatch signal from which the modified interference sensor signal has been cancelled. This modified mismatch signal is provided as an input signal to the amplitude measurement system 33 and as the output signal of the AIC system at terminal 38. The output of the measurement system 33 is coupled to the input of AIC processor 34. If desired, the amplitude measurement system 33 may be part of processor 34.

The AIC processor 34 is designed to provide control signals to the phase and amplitude adjustment system 36 which result in minimization of the amplitude measured by system 33. This corresponds to a condition in which the amplitude of the component of the modified mismatch signal at the frequency $F_I$ of the interference sensor signal is minimized.

Figure 4:
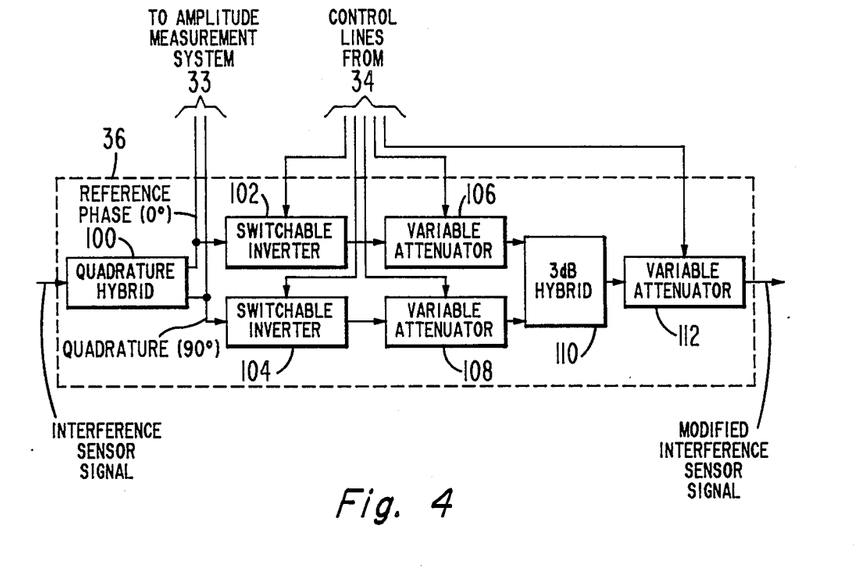
FIG. 4 illustrates an exemplary embodiment of a phase and ampitude weighting or adjustment system useful in the adjustment system of FIG. 3.

An exemplary form of the amplitude and phase adjustment system 36 is illustrated in FIG. 4. A quadrature hybrid 100 receives the interference sensor signal at its common input and provides output signals at its output terminals which have relative phases of 0° and 90°. The reference phase signal is applied to the input of a switchable inverter 102 which is switchable between inverting and non-inverting conditions. This inverter can comprise an inverting amplifier which is switched into and out of the signal path or an amplifier whose input connection is switched between inverting and non-inverting ports. This inverter may provide gain if desired. The output of the switchable inverter 102 is connected to the input of a variable signal transmission device which may be an amplifier or attenuator and which is illustrated as an attenuator. The output of the variable attenuator 106 is connected to a first branch terminal of a 3dB hybrid 110. The other signal which undergoes an additional 90° relative phase shift at quadrature hybrid 100 is connected to the input of a switchable inverter 104 like inverter 102. The output of the inverter 104 is connected to the input of a variable attenuator 108 like the variable attenuator 106. The output of the variable attenuator 108 is connected to a second branch terminal of the 3dB hybrid 110. The common terminal of the 3dB hybrid 110 provides a signal having the same frequency as the interference sensor signal; but whose phase is controllable over a range of 0°-360°. The output of 3dB hybrid 110 is connected to the input of a variable attenuator 112. The output of attenuator 112 is the modified interference sensor signal which is provided to the combiner 32. Both of the switchable inverters (102 and 104) and all three variable attenuators (106, 108 and 112) operate under the control of signals provided by the AIC processor 34. With both switchable inverters set to their non-inverting condition, the phase of the modified interference sensor signal may be set to any relative phase value between 0° and 90° by appropriate selection of the attenuations provided by the variable attenuators 106 and 108. This continuous phase shift variation can be achieved while maintaining a constant output amplitude. See for instance, U.S. Pat. No. 4,297,641 to Sterzer assigned to the present assignee. The 0° to 90° relative phase shift range provided when both switchable inverters are non-inverting can be changed to a 90°-180° range by setting inverter 102 to the inversion condition and inverter 104 to the non-inverting condition. A phase range from 180° to 270° may be provided by setting both inverter 102 and inverter 104 to the inverting condition. A phase shift between 270° and 360° (0°) may be provided by setting inverter 102 to the non-inverting condition and inverter 104 to the inverting condition.

The settings of the inverters 102 and 104 and the attenuators 106 and 108 which will provide any desired relative phase shift for the modified interference sensor signal may be stored in a look up table such as a read only memory (ROM) for rapid access during the adaptive interference cancellation process. Preferably, the selected phase value serves as the address signal for four different ROMs. The output of each ROM is a digital value suitable for controlling the setting of a different one of the four control elements—inverters 102 and 104 and attenuators 106 and 108. If an attenuator is used which requires analog control signals, a digital-to-analog converter may be used to convert the digital value to an appropriate analog value. The amplitude of the modified interference sensor signal can be controlled by changing the settings of the attenuators 106 and 108 together to produce the desired amplitude of the modified interference sensor signal without changing its phase. However, for simplicity of operation and explanation, it is preferred to have attenuator 112 control the amplitude. The amplitude setting selected may preferably serve as the address of another ROM whose output is the appropriate control value for attenuator 112.

The amplitude of the component of the modified mismatch signal at the interference sensor signal frequency $F_I$ is measured in amplitude measurement system 33. This measurement system is illustrated in block diagram form in FIG. 5. This system receives three input signals—the modified mismatch signal from the output of combiner 32 and both the reference phase and 90° (quadrature) signals from the output of quadrature hybrid 100 of the amplitude and phase adjustment system 36.

The amplitude measurement system 33 comprises two mixers 142 and 144, two low-pass filters 146 and 148 and two magnitude detectors 150 and 152 and a two-input sum circuit 154. The mixers, low-pass filters and magnitude detectors are arranged in two parallel channels. In each of these channels the output of a mixer is connected to the input of a low-pass filter whose output is, in turn, connected to the input of a magnitude detector. An upper channel 140 in FIG. 5 comprises the mixer 142, low pass filter 146 and the magnitude detector 150. The mixer 142 has its first input connected to receive the output of combiner 32 and its second input connected to receive the reference phase signal from the amplitude and phase weighting system 36. A lower channel 141 in FIG. 5 comprises the mixer 144, the low-pass filter 148 and the magnitude detector 152. The first input of mixer 144 is the signal from combiner 32. The second input to mixer 144 is the 90° or quadrature relative phase signal with respect to the reference signal from quadrature hybrid 100 in the amplitude and phase weighting system 36. The output terminals of magnitude detectors (150 and 152) are connected to input terminals of the sum circuit 154. Sum circuit 154 may be a summing amplifier or another appropriate-circuit as desired. The output of sum circuit 154 is an analog signal. For digital processing in AIC processor 34 the output from sum circuit 154 is applied to an analog-to-digital (A to D) converter 156 and the digital output of converter 156 is coupled as the input to the AIC processor 34.

Figure 5:
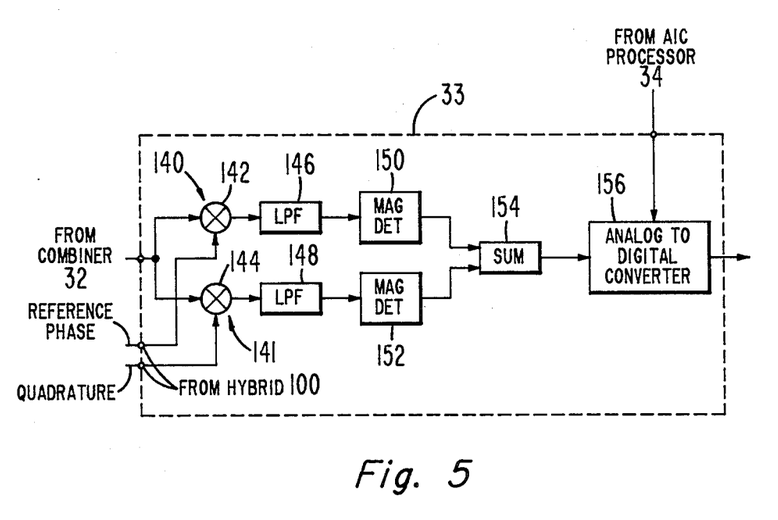
FIG. 5 is a block diagram of an exemplary amplitude measurement system useful in the adjustment system of FIG. 3.

Since the interference sensor signal at terminal 31 (FIG. 3) is the pure carrier frequency $F_I$ of the other radio, the outputs of the mixers 142 and 144 contain signals at $2F_I$, $F_I+F_O$, $F_I-F_I$ and either $F_I-F_O$ or $F_O-F_I$, whichever is positive. The signal at $F_I-F_I$ is a DC signal. This DC signal passes through low pass filters 146 and 148, but all of the other signals are blocked by the low-pass filters whose cut-off frequency is less than the difference between two adjacent operating frequencies of the radios. The input signals to magnitude detectors 150 and 152 are DC signals. The magnitude detectors 150 and 152 detect the polarity of those signals and invert them if necessary to provide positive output signals. The sum circuit 154 sums those signals to provide a "magnitude" signal. This "magnitude" signal is not a true magnitude signal unless it is formed by squaring the two inputs, summing them and taking the square root. However, the result of a simple summation of two signals of the same polarity is sufficient for operation of this AIC loop. A to D converter 156 provides a binary representation of the magnitude from the summer. This is applied to AIC processor 34 as its input signal.

The AIC processor 34 is preferably a microprocessor which receives the digital signal from measurement system 33 which specifies the measured amplitude. The processor 34 operates on these digital values in a successive approximation manner to minimize the power in the received mismatch signal. This process begins with picking initial transmission amplitude and phase settings for the amplitude and phase adjustment system 36. These initial settings are preferably zero amplitude and a phase setting of 0° (no change in phase). The resulting input power to the AIC processor is determined and new amplitude and phase values are selected and the resulting power level is determined. Further values for amplitude and phase are selected based on prior values and their associated power levels. The AIC processor may utilize any of the well-known adaptive interference cancellation algorithms for selecting the phase and attenuation changes to be made in the interference sensor signal in converting it to the modified interference sensor signal. Within the AIC processor, the selected amplitude and phase values are converted to control signals for the switchable inverters 102 and 104 and the variable attenuators 106 and 108. The AIC processor directly selects amplitude and phase values rather than the settings of the inverters and attenuators because amplitude and phase are continuous whereas the settings of the inverters 102 and 104 are discontinuous and require coordinated changes in the settings of the variable attenuators 106 and 108 in order to be able to produce a continuous variation in the phase of the modified interference signal. The adaptive interference cancellation system 30 may be like that described in pages 1698–1701 of the article entitled, "Adaptive Noise Cancelling: Principles and Applications" by Woodrow, et al. which appeared in the proceedings of the IEEE Volume 63, #12, Dec. 1975 pp. 1692–1716. This article is incorporated herein by reference.

Figure 6:
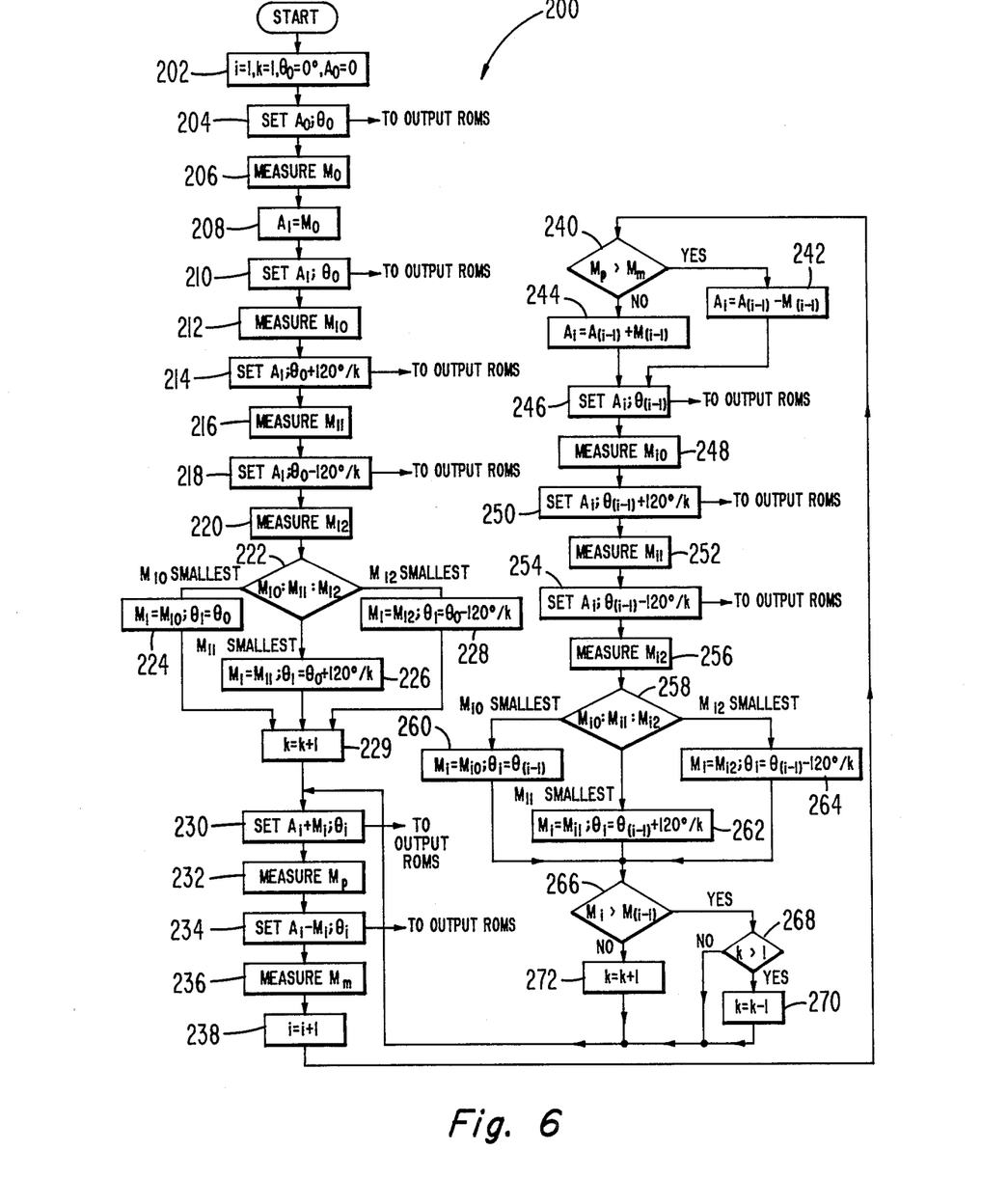
FIG. 6 is a flow chart of a preferred process for use with the adjustment system of FIG. 3.

A preferred process for determining the proper settings of the amplitude and the phase adjustment system 36 is illustrated in flow chart form in FIG. 6. Steps 202 through 229 initialize the process when the AIC system is initially activated on any given frequency retuning cycle. In step 202, two index values i and k are each set to the value "1". The initial phase change ($\theta_0$) introduced into the interference sensor signal by the amplitude and phase adjustment system 36 is set to the value "0" and the initial amplitude ($A_0$) of the signal emerging from the amplitude and phase adjustment system 36 is also set to "0". For simplicity and clarity in the description of the operation of the AIC system 30, the description is in terms of setting the amplitude of the signal emerging from the amplitude and phase adjustment system 36 rather than as a percentage of attenuation of the interference sensor signal in passing through that system. Where the interference sensor signal has a constant amplitude as received at terminal 31, the conversion between a desired amplitude and the setting of the attenuator 112 is straight forward and may be accommodated in the ROM which stores the values for setting attenuator 112. In the event that the interference sensor signal is not received with a constant amplitude, an automatic gain control circuit may be inserted between the terminal 31 and the amplitude and phase adjustment system 36 in order to accomplish this purpose. In step 204, the amplitude and phase adjustment system is provided with control signals to set the amplitude and phase to the values $A_0$ and $\theta_0$. In step 206, amplitude measurement system 33 measures the amplitude of the $F_I$ (interfering) component of the modified mismatch signal. This measured value is referred to as $M_0$. A delay is built into either the setting step 204 or the measurement step 206 to enable the amplitude and phase adjustment system 36 to settle to its new values before the measurement is made. This delay is present in each combination of setting and measurement steps in this process, but is not explicitly shown in the flow chart 200 to avoid unduly complicating the flow chart. In step 208 the amplitude $A_1$ is set equal to the amplitude $M_0$ which was measured in step 206. In step 210, amplitude and phase adjustment system 36 is reset to the amplitude $A_1$ and the phase $\theta_0$. In step 212 amplitude measurement system 33 measures the resulting amplitude which is identified as $M_{10}$. In step 214, amplitude and phase adjustment system 36 is reset to the amplitude $A_1$ and the phase $\theta_0 + 120°$. Step 216 measures the resulting amplitude which is identified as $M_{11}$. In step 218 the amplitude is set to $A_1$ and the phase is reset to $\theta_0 - 120°$. In step 220 the resulting amplitude is measured and identified as $M_{12}$. In step 222 the three amplitude values $M_{10}$, $M_{11}$ and $M_{12}$ are compared. If the amplitude $M_{10}$ is smallest, then the process proceeds to step 224. If amplitude $M_{11}$ is smallest, the process proceeds to step 226. If amplitude $M_{12}$ is smallest, the process proceeds to step 228. In the event that two of the amplitudes are equal and smaller than the third one, then arbitrarily, the amplitude having the lowest second subscript numeral is treated as the smallest one. When step 224 is executed an amplitude value $M_1$ is set equal to the amplitude value $M_{10}$ and the phase $\theta_1$ is set equal to $\theta_0$. When step 226 is executed the amplitude $M_1$ is set equal to $M_{11}$ and the phase $\theta_1$ is set equal to $\theta_0 + 120°$. When step 228 is executed the amplitude $M_1$ is set equal to $M_{12}$ and the phase $\theta_1$ is set equal to $\theta_0 - 120°$. Step 229 follows whichever of steps 224, 226 or 228 is executed. In step 229 the index k is incremented by 1.

In step 230, amplitude and phase adjustment system 36 is reset to the amplitude $A_i + M_i$ and to the phase $\theta_1$. At this first execution of step 230, i still has value 1 which was set initially. In step 232 the amplitude of the resulting signal is measured and identified as $M_p$. The subscript "p" identifies the amplitude as resulting from the setting $A_i$ plus $M_i$. In step 234 adjustment system 36 is reset to the amplitude $A_i - M_i$ and the phase $\theta_1$. In step 236 the resulting amplitude is measured and identified as $M_m$. The subscript "m" identifies the fact that this amplitude resulted from the setting $A_i$ minus $M_i$.

In step 238 the value of i is incremented by 1. In step 240 the amplitude $M_p$ is compared with the amplitude $M_m$. If the amplitude $M_p$ is greater than the amplitude $M_m$ than step 242 is executed, otherwise step 244 is executed. In step 242 the new amplitude value $A_i$ is set equal to the old amplitude value $A_{(i-1)}$ minus the most recent measured amplitude $M_{(i-1)}$. The subscripts on these "old" values are $(i-1)$ in steps 242 and 244 because i was incremented in step 238. In step 244 the new value of $A_i$ is set equal to the old amplitude value $A_{(i-1)}$ plus the most recent measured value of $M_{(i-1)}$. Steps 240, 242 and 244, together serve to set the new amplitude value $A_i$ to the value which produced the smaller measured value ($M_p$ or $M_m$) at the measurement system 33. Following whichever of steps 242 and 244 is executed, the process proceeds to step 246 where the adjustment system is reset to the new amplitude value $A_i$ (where at this execution i has the value of 2) and to the most recent $\theta$ value $\theta_{(i-1)}$ which at this execution has the value $\theta_1$. In step 248 the resulting amplitude is measured and identified as $M_{i0}$. In step 250 the amplitude is reset to $A_i$ and the phase is reset to $\theta_{(i-1)} + 120°/k$. In step 252 the resulting amplitude is measured and identified as $M_{i1}$. In step 254 the amplitude is set at $A_i$ and the phase is reset at $\theta_{(i-1)} - 120°/k$. Step 256 measures the resulting amplitude and identifies it as $M_{i2}$. Since the value of k is 2 at these first executions of steps 250 and 254 they provide phases which are respectively plus and minus 60° from the previous $\theta$ value $\theta_1$ which was set by the one of the steps 224, 226 and 228 which was executed.

In step 258 the three amplitudes $M_{i0}$, $M_{i1}$ and $M_{i2}$, are compared. From step 258 the process proceeds to step 260, step 262 or step 264 in accordance with which of the three amplitude values is smallest. The steps 258 through 264 are respectively similar to the corresponding steps 222 through 228. Following whichever of steps 260, 262 and 264 is executed, the process proceeds to step 266 where the amplitude value $M_i$ is compared with the previous amplitude value $M_{(i-1)}$. At this first execution of step 266, this is a comparison between the values $M_2$ and $M_1$. If the amplitude $M_i$ is greater than the amplitude $M_{(i-1)}$ then the process proceeds to step 268, otherwise it proceeds to step 272. In step 268 the value of k is tested to see if it is greater than 1. If it is, the process proceeds to step 270 where the value of k is decremented by 1. If the value of k in step 268 is not greater than 1, then the step 270 is bypassed. In step 272, the value of k is incremented by 1. Following the last of the steps 268, 270 and 272 to be executed in any given pass through the process, the process returns to step 230.

In the situation where in step 266 the value $M_i$ is greater than the $M_{(i-1)}$, this is an indication that changes in the mismatch signal itself have caused an increase in the amplitude or a change in the phase of the $F_I$ component of the modified mismatch signal. In step 270 under those conditions, k is decremented by 1 to increase the phase change tested in the next execution of steps 250 and 254 in order to rapidly converge on the new phase and amplitude values which result in minimization of the $F_I$ component in the modified mismatch signal.

This amplitude and phase adjustment process will proceed around the loop extending from step 230 through step 272 continuously until the end of the antenna matching network adjustment cycle. This amplitude and phase adjustment process will restart with step 202 during the next antenna matching network adjustment cycle. This continuous execution of the loop beginning with step 230 assures that the modified mismatch signal will continuously be adjusted to maintain a minimum value of the $F_I$ component.

With the switch 70 set with the AIC output terminal 38 connected to terminal 28 as shown, the input to the matching adjustment processor 23 of the adjustment loop 20' is the modified mismatch signal from the AIC system 30. Since this signal is substantially free of the frequency of the interference sensor signal, the adjustment processor 23 is able to accurately determine how well the network 21 is matched to the transmission frequency of its own radio in the presence of transmission by the interfering radio so long as the interference sensor signal is the carrier frequency of that interfering radio. The response of the low power AIC system 30 is generally much more rapid than the response of the impedance adjuster 24. Consequently, the inclusion of the AIC loop in the adjustment system allows the adjustment process to proceed as rapidly in the presence of an interfering signal as it would in the absence of such a signal.

Figure 7:
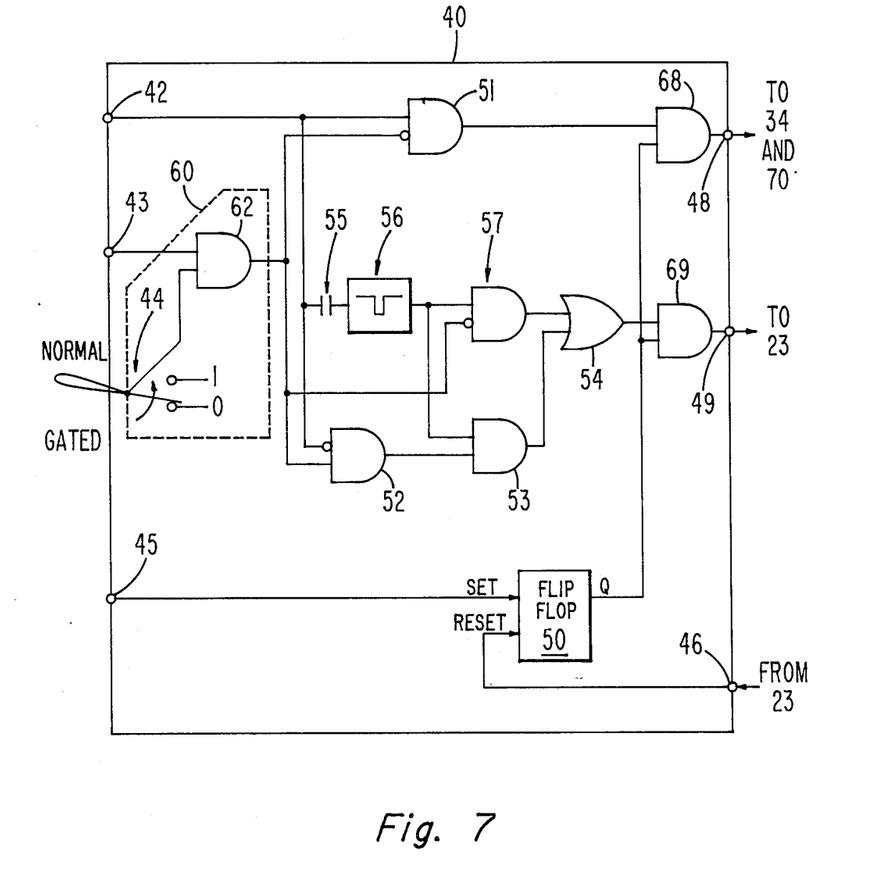
FIG. 7 illustrates a preferred embodiment of a timing and control system for use in the system of FIG. 3.

Timing and control system 40 can take many different forms. An illustrative embodiment is illustrated in FIG. 7.

Timing and control system 40 controls the operation of the AIC system 30 and the adjustment loop 20' in a manner to produce proper adjustment of the matching network 21 in accordance with the operating conditions of the two radios. In order to perform this function, timing and control system 40 receives from the other (interfering) radio a signal at an input terminal 42 which indicates when the transmitter of the interfering radio is turned on and a signal at input terminal 43 which indicates when the interfering radio is operating in a frequency hopping mode. Frequency hopping involves frequent changes in the operating frequency of a radio. This operation is discussed after an explanation of the provisions for the normal or non-frequency hopping operation. Timing and control system 40 receives a readjust signal at an input terminal 45 when the network 21 is to be readjusted and receives at input terminal 46, the signal from adjustment processor 23 which indicates when the readjustment process is complete.

Timing and control system 40 has two output terminals 48 and 49. Output terminal 48 provides a control signal to switch 70 and AIC processor 34. Output terminal 49 provides a control signal to adjustment processor 23.

Input terminal 45 which receives the readjust control signal from timing and control system 40's own radio is connected to the set input of a set/reset flip-flop 50. Input terminal 46 which receives the readjustment complete signal from adjustment processor 23 is connected to the reset input of flip-flop 50. The Q output of flip-flop 50 which is true or a logical one when the flip-flop is set is connected to a first input terminal of each of two output control AND gates 68 and 69. Output control AND gates 68 and 69 each have two inputs and have their outputs connected to output terminals 48 and 49, respectively, of timing and control system 40.

Input terminal 42 is connected to a first, non-inverting input terminal of a two-input AND gate 51, to a first, inverting input of a two-input AND gate 52 and through a differentiating capacitor 55 to the input of a one-shot multivibrator 56. The second input terminal of AND gate 51 is inverting and is connected to receive the signal from the output of a frequency hopping control portion 60 of timing and control system 40. The output of AND gate 51 is connected to the second, non-inverting input of the output control AND gate 68. The second, non-inverting input of AND gate 52 is connected to receive the output signal from the frequency hopping control portion 60 of timing and control system 40. The output of AND gate 52 is connected to a first, non-inverting, input of a two-input AND gate 53. The second, non-inverting, input of AND gate 53 is connected to the output of multivibrator 56. The output of AND gate 53 is connected to a first input of a two-input OR gate 54. The output of multivibrator 56 is also connected to a first, non-inverting, input of a two-input AND gate 57. The second, inverting input of AND gate 57 is connected to the output of frequency hopping control portion 60 of timing and control system 40. The second input of OR gate 54 is connected directly to the output of AND gate 57.

Multivibrator 56 provides a high voltage or logic one as its output at all times except for a predetermined short pulse of low voltage or logical zero output each time it fires in response to an input pulse received through differentiating capacitor 55. Multivibrator 56 fires each time the voltage level at input terminal 42 changes its logical state—either from logic zero (low voltage) to logic one (high voltage) or from logic one (high voltage) to logic zero (low voltage).

The output of OR gate 54 is connected to the second, non-inverting input of output control AND gate 69.

Some modern radios employ electronic switching of the matching network and switch frequencies rapidly in order to maintain communication security. This is referred to as frequency hopping. Where the interfering radio is operating in a frequency hopping mode in which its transmission frequency switches rapidly among a number of frequencies, there are two alternatives. One of these alternatives is for the adjustment system 100 to operate in the same fashion as when the frequency of the interfering radio is constant. This can be done only if the adaptive interference cancellation processing system responds rapidly to each change in the frequency of the interfering radio. The other alternative is to gate the operation of the matching network adjustment system. This will be necessary if the frequency hopping is sufficiently rapid that changes in the amplitude and phase settings of the amplitude and phase adjustment system are required more rapidly than the AIC system 30 can respond. In that situation, the AIC system is unable to maintain the modified mismatch signal sufficiently free of the interference signal for the matching adjustment processor to determine proper adjustment of matching network 21. Frequency hopping control portion 60 of timing and control system 40 determines which of these alternatives is used in the tuning system 100.

The frequency hopping control portion 60 of timing and control system 40 comprises a single pole double throw mode switch 44 and a two-input AND gate 62 and receives two external inputs. The first external input is the signal received at input terminal 43 from the interfering radio which indicates whether that interfering radio is operating in a frequency hopping mode. This signal is a logical zero unless the interfering radio is operating in a frequency hopping mode. It is a logic one when that radio is operating in a frequency hopping mode. The second external input is supplied in the form of the setting of a mode switch 44. This mode switch has two settings a "normal" setting and a "gated" setting. In the "normal" setting of switch 44, the signal at the common terminal of the switch is a logic zero (low voltage). In the "gated" setting of switch 44, the signal at the common terminal is a logic one (high voltage). Input terminal 43 is connected to the first, non-inverting input of AND gate 62. The second, non-inverting input of AND gate 62 is connected to the common terminal of mode switch 44. The output of AND gate 62 is the output of frequency hopping control 60 and is connected to the second, inverting input of AND gate 51, to the second, non-inverting input of AND gate 52 and to the second, inverting input of AND gate 57, as has been described.

In operation, when the radio is to be retuned the signal at terminal 45 of timing and control system 40 changes from a logic zero to a logic one. This causes flip-flop 50 to change to the set state in which its Q output signal is a logic one. This output signal enables both output control AND gates (68 and 69) so that control signals generated within timing and control system 40 can be transmitted to adjustment processor 23, AIC processor 34 and switch 70.

Operation in which the interfering radio is operating in a normal (non-frequency hopping) mode will be described first. In this situation, the input signal at terminal 43 is a logic zero and the output of AND gate 62 is a logic zero. This enables AND gates 51 and 57 and disables AND gate 52.

If the transmitter of the interfering radio is off, then the input signal at input terminal 42 is a logic zero and the output of AND gates 51 and 68 are both logic zeros. Thus, the control signal supplied to AIC processor 34 and switch 70 is a logic zero. In response to a logic zero control signal, AIC processor 34 is held in a paused state in which no processing is done. In response to a logic zero control signal, the switch 70 is held in its normal position (not shown) in which its common contact 71 is connected to its first branch terminal 72. This connects the mismatch signal directly to the input of adjustment processor 23.

With AND gate 57 enabled by the logic zero output from frequency hopping control 60, the logic one output from mulivibrator 56 is passed through AND gate 57 to OR gate 54 and output control AND gate 69 to output terminal 49. This logic one at terminal 49 when received by adjustment processor 23 as its control input causes processor 23 to run.

If there are no changes in the inputs at terminals 42 and 43, adjustment processor 23 will run until it determines that matching network 21 is properly adjusted. At that point adjustment processor 23 changes the value of its adjustment status output signal from a logic zero to a logic one to signify that the adjustment process is complete. This signal is coupled to the reset input of flip-flop 50 via input terminal 46 and causes flip-flop 50 to reset. This causes the Q output of the flip-flop to assume a logic zero state which disables output control AND gates 68 and 69, causing their outputs to become logic zeros. This places adjustment processor 23 and AIC processor 34 in pause states and causes switch 70 to assume its normal position (which it is already in in the present example).

The logic one state of the adjustment processor status signal is also provided to the radio itself and causes it to resume normal operation at the new frequency.

If the input at terminal 42 changes to a logic one (indicating that the transmitter of the interfering radio is now on) during the process of tuning the coupler 21, a logic one is provided at the output of AND gate 51 since the logic zero output of AND gate 62 is inverted. Since AND gate 68 is enabled by the Q output of flip-flop 50, the logic one at the output of AND gate 51 is enabled from AND gate 68 and a logic one control signal is provided to switch 70 and AIC processor 34. The logic one at the control input of AIC processor 34 causes it to run in a normal AIC manner to cause the output of AIC system to be the modified mismatch signal from which the interference sensor signal frequency has been cancelled. The logic one input to switch 70 causes it to switch to its AIC position (as shown) in which its common terminal 71 connects to its second branch terminal 73 to which the output of AIC system 30 is connected. This includes the AIC system 30 within the adjustment loop 20'. The adjustment loop 20' then operates in its normal manner with the modified mismatch signal substituted for the mismatch signal at the input to processor 23 until adjustment is achieved.

At the time the signal at input terminal 42 of timing and control sytstem 40 changes to a logic one, that change in voltage level causes differentiating capacitor 55 to produce a current pulse which triggers multivibrator 56 to produce a pulse of low voltage (logic zero) having a predetermined duration. This logic zero causes the output of AND gate 57 to change from a logic one to a logic zero for the duration of that pulse. The logic zero from AND gate 57 causes OR gate 54 to change its output to a logic zero because AND gates 52 and 53 both have logic zeros as their outputs. The logic zero value at the output of OR gate 54 is provided at the output of control AND gate 69 and thence to adjustment processor 23. This logic zero value causes adjustment processor 23 to pause for the duration of multivibrator pulse. At the end of the multivibrator pulse, the output of the multivibrator returns to a logic one which propagates through AND gate 57, OR gate 54 and AND gate 69 to adjustment processor 23, causing processor 23 to return to the normal processing state. This pausing of adjustment processor 23 is to ensure that it does not respond to transient mismatch signals prior to AIC system 30 cancelling the frequency of the other radio's transmitter from the modified mismatch signal.

If prior to completion of the coupler readjustment process, the transmitter of the interfering radio turns back off, then the signal at input 42 returns to a logical zero value and differentiating capacitor 55, multivibrator 56, AND gate 57 and OR 54 cause adjustment processor 23 to pause for the duration of the multivibrator pulse to prevent processor 23 from responding to transient signals. This logic zero at input 42 also causes the AIC processor to pause and switch 70 to switch to its non-AIC position to bypass AIC system 30, both for so long as the value at terminal 42 is a logic zero.

AIC processor 34 is paused during the time the interfering radio's transmitter is off to retain the phase and amplitude weight settings of the phase and amplitude weighting system 36 fixed in anticipation of further adjustment if the interfering transmitter turns back on prior to completion of the adjustment process. If processor 34 were not paused, it would drive the phase and amplitude weighting system 36 to provide a zero amplitude modified interference sensor signal because during the time the other transmitter is off, the mismatch signal received by the AIC system is substantially free of the frequency of the interference sensor signal. This is a condition in which the modified interference sensor signal must have a zero amplitude in order for the modified mismatch signal to be free of the frequency of the interference sensor signal.

If pausing matching adjustment processor 23 is considered unnecessary, then capacitor 55, multivibrator 56, AND gates 53 and 57 and OR gate 54 may be omitted from timing and control system 40 with the output of AND gate 52 connected to the input of output control AND gate 69 in place of the output of OR gate 54.

If the interfering radio is operating in a frequency hopping mode, then the signal at input terminal 43 is a logic one. This signal applied to the first input of AND gate 62 enables AND gate 62 for propagating of the logic value provided by switch 44. If switch 44 is in its normal position, a logic zero is provided to the second input of AND gate 62 and the output of AND gate 62 is a logical zero. This logical zero enables AND gates 51 and 57 and disabled AND gate 52. The timing and control system 40 and the overall tuning system 100 then operate in the same manner as described above. The only change is that each time the transmitter of the interfering radio turns on, it is operating at a different frequency. This causes the interference sensor signal to change frequency each time the interfering transmitter turns on. As a result the AIC system 30 must produce new amplitude and phase weights which are appropriate to the new frequency of the interference sensor signal each time the interfering transmitter comes on. If proper adjustment can be achieved under these conditions, this normal operation in the face of frequency hopping of the interfering radio is the fastest way of adjusting the matching network 21. After operating on all available frequencies the appropriate settings for amplitude and phase adjustment system 36 are known for each frequency. Storing these values in a memory and retrieving these when a frequency is revisited will permit more rapid AIC operation, provided matching network 20 has not changed significantly. In the event of change, the AIC system will correct for it.

If the duration of the transmission by the interfering radio at each of its frequencies is too short for the AIC system to provide the required new phase and amplitude settings, then the switch 44 is switched to the gated position in which the common terminal of switch 44 provides a logic one to the second input of AND gate 62 and AND gate 62 provides an output which is a logic one. This logic one is applied to the second input of AND gate 51. Since this second input of AND gate 51 is inverting, this logic one disables AND gate 51 and its output becomes a logic zero. After propagation through AND gate 68 to switch 70, this logic zero causes switch 70 to set to its normal, non-AIC position in which its common contact 71 is connected to branch contact 72 to disconnect AIC system 30 from adjustment loop 20'.

The logic one output from AND gate 62 is also applied to the second, non-inverting input of AND gate 52. This enables AND gate 52. The signal at input terminal 42 is coupled to the first, inverting input of AND gate 52 with the result that the output of AND gate 52 is a logic zero when the signal at 42 is a logic one. This logic zero causes the output of AND gate 53 to be a logic zero. AND gate 57 is disabled by the logic one output of AND gate 62 which is applied to the inverting input of AND gate 57. Consequently, the logic zero from AND gate 53 produces a logic zero at the outputs of OR gate 54 and AND gate 69. In response to this logic zero control input, adjustment processor 23 pauses while the interfering transmitter is on.

When the transmitter of the interfering radio turns off to change frequencies the signal at input terminal 42 changes to a logic zero. This state change causes multivibrator 56 to produce a pulse which disables AND gate 53 for the duration of the pulse. The logic zero at terminal 42 applied to the inverting input of AND gate 52 causes AND gate 52 to produce a logic one as its output. This logic one is applied to AND gate 53, but is not enabled until the end of the multivibrator pulse at which time both inputs of AND gate 53 are logic ones. This causes AND gate 53 to produce a logic one at its output. A logic one is then provided from OR gate 54 and AND gate 69 to matching adjustment processor 23. This logic one causes processor 23 to run, processing the mismatch signal and sending commands to impedance adjuster 24. Processor 23 runs so long as the interfering transmitter is off (the signal at 42 is a logic zero). When the signal at terminal 42 changes back to a logic one (when the interfering transmitter turns on at its new frequency), a logic zero is produced by AND gate 52 and propagated to adjustment processor 23 to cause it to pause again. This cycle repeats until adjustment processor 23 determines that proper adjustment has been achieved and generates its adjustment complete signal which resets flip-flop 50 which disables AND gates 68 and 69.

The adjustment process using gating during frequency hopping operation of the interfering transmitter may take considerably longer than normal because the adjustment processor 23 must pause during the transmission periods of the interfering radio. However, adjustment is completed substantially sooner than if the prior art technique of waiting until the interfering transmitter is inactive to readjust the matching network were used. If the impedance adjustment speed is limited by a slowly moving mechanical impedance adjuster 24 then the increase in adjustment time may be minimal.

The timing and control system 40 and switch 70 may be omitted and the AIC system 30 permanently wired into adjustment loop 20' if desired. In such a system, the adjustment processor 23 will always receive the modified mismatch signal. When the freuqency of the interference sensor signal is *not* present in the mismatch signal, amplitude and phase adjustment system 36 then provides a modified interference sensor signal having zero amplitude and the modified mismatch signal is the same as the mismatch signal. When the interference sensor signal is present in the mismatch signal, this modified system will operate in the same way as previously described.

If the matching network 21 is adjusted by electronically switching capacitors and inductors into and out of the network rather than relying on mechanical adjustment of electrical components, the impedance adjuster 24 and the matching network 21 may be integrally related in their location and operation. In that situation, the switches which perform the electronic switching of components comprise the impedance adjuster 24 while the switched components themselves are a part of the matching network 21.

By allowing the adjustment of the matching network of a radio at any desired time, the system 100 enables maximum simultaneous operation between two of an aircraft's radio systems with a minimum of interference between them.

As shown and described, this system solves the problem of the simultaneous transmission or tuning use of a second radio during the retuning of a first radio. In the event that three radios were present, the system could be modified either by the addition of a second AIC system in tandem with the system 30 or by use in system 30 of a phase and amplitude weighting system having the ability to provide two phases and two amplitudes.

In a system in which the radios incorporate electronically switched matching networks, the setting of each radio's network can be stored for each of its own transmission frequencies and switched immediately to the desired condition on each frequency change. Such a procedure is necessary in a frequency hopping radio which is to switch frequencies rapidly. If there is sufficient interaction between the radio systems that the proper setting of the network of the first radio system at a given frequency is dependent on the frequency of operation of the other radio, then in addition to storing the network settings for a given transmission frequency of its own radio, the system may also store network settings on the basis of the frequencies of both radios in order to set each network to the optimum condition for the conditions under which its radio is then operating.

What is claimed is:

1. In a system for adjusting the impedance of an antenna matching network to match an antenna at a desired carrier frequency in which said system is of the type including said antenna matching network, means for adjusting the impedance of said matching network, means for providing a mismatch signal representative of the condition of said matching network during the transmission of a tuning signal therethrough and a matching adjustment processor responsive to said mismatch signal for controlling said means for adjusting, the improvement for cancelling from said mismatch signal an interfering signal having a different frequency than said tuning signal, comprising:

means for providing an interference sensor signal having the frequency of said interfering signal;

means responsive to said interference sensor signal and phase and amplitude control signals for providing a modified interference sensor signal having a phase and amplitude determined by said control signals;

means for combining said modified interference sensor signal and said mismatch signal to provide a modified mismatch signal;

an adaptive interference cancellation (AIC) processing system responsive to said modified mismatch signal for providing said phase and amplitude control signals of values that reduce the amplitude of said interfering signal in said modified mismatch signal relative to its amplitude in said mismatch signal; and     means for coupling said modified mismatch signal to said adjustment processor.

2. The improvement recited in claim 1 wherein said AIC processing system comprises:

means for measuring the amplitude of said interfering signal in said modified mismatch signal; and     means for adaptive interference cancellation (AIC) responsive to said amplitude measurement for providing said control signals.

3. The improvement recited in claim 2 wherein said means for adaptive interference cancellation includes:

means for selecting initial values for said control signals;

means for storing said measured amplitude of the resulting modified mismatch signal; and     means for updating said control signals to minimize said measured amplitude of said modified mismatch signal.

4. The improvement recited in claim 3 wherein said means for updating said control signals comprises:

means for selecting current control signal values by modifying a previous set of control signal values;

means for storing said current control signal values, means for storing the current measured amplitude of the modified mismatch signal which results from said current control signals;

means for comparing said current stored measurement of said modified mismatch signal with other stored measurements of said modified mismatch signal; and     means for selecting, in accordance with the results of said comparisons, an updated set of control signal values to replace said previous set of control signal values.

5. In a system for adjusting the impedance of an antenna matching network to match an antenna at a desired carrier frequency in which said system is of the type having a first loop including said antenna matching network, means for adjusting the impedance of said matching network, means for providing a mismatch signal representative of the condition of said matching network during the transmission of a tuning signal therethrough and a matching adjustment processor responsive to said mismatch signal for controlling said means for adjusting, the improvement comprising:

a second loop for cancelling from said mismatch signal an interfering signal having a different frequency than said tuning signal, said second loop comprising:

means for providing an interference sensor signal having the frequency of said interfering signal;

means responsive to said interference sensor signal and phase and amplitude control signals for providing a modified interference sensor signal having a phase and an amplitude determined by said control signals;

means for combining said modified interference sensor signal and said mismatch signal to provide a modified mismatch signal; and         an adaptive interference cancellation (AIC) processing system responsive to said modified mismatch signal for providing phase and amplitude control signals of values that reduce the amplitude of said interfering signal in said modified mismatch signal relative to its amplitude in said mismatch signal; and     means for selectively switching said second loop into and out of said first loop and for coupling said modified mismatch signal to said adjustment processor in place of said mismatch signal when said second loop is switched into said first loop.

6. In a system for adjusting the impedance of an antenna matching network to match an antenna at a desired carrier frequency in which said system is of the type including said antenna matching network, means for adjusting the impedance of said matching network, means for providing a mismatch signal representative of the condition of said matching network during the transmission of a tuning signal therethrough, a matching adjustment processor responsive to said mismatch signal for controlling said means for adjusting, means for receiving an interference sensor signal having the frequency of an interfering signal, modifier means responsive to said interference sensor signal and phase and amplitude control signals for providing a modified interference sensor signal having a phase and amplitude determined by said control signals, means for combining said modified interference sensor signal and said mismatch signal to provide a modified mismatch signal, an adaptive interference cancellation processing system responsive to said modified mismatch signal for providing said phase and amplitude control signals of values that reduce the amplitude of said interfering signal in said modified mismatch signal relative to its amplitude in said mismatch signal, and means for coupling said modified mismatch signal to said adjustment processor, a method of cancelling interference from said mismatch signal comprising the steps of:

(a) providing from said AIC processor to said modifier means amplitude and phase control signals to cause the modified interference sensor signal to have a zero amplitude;

(b) measuring the amplitude of said interfering signal in said modified mismatch signal while said modified interference sensor signal amplitude is zero;

(c) establishing an amplitude control signal which will set the amplitude of said modified interference sensor signal to substanitally the amplitude measured in step (b) and providing said established amplitude control signal from said AIC processor to said modifier means;

(d) providng from said AIC processor to said modifier means a plurality of phase control signal values and measuring the resulting amplitude of said interfering signal in said modified mismatch signal for each of said phase control signal values; and (e) selecting as a new phase control signal value the one of said plurality of phase control signal values which in step (d) results in a minimum measured amplitude of said interfering signal in said modified mismatch signal.

7. The method recited in claim 6 further comprising the steps of:

(f) providing from said AIC processor to said modifier means an amplitude control signal having a value to provide said modified interference sensor signal with an amplitude equal to its established value plus the minimum measured amplitude of said interfering signal in step (e) and measuring the resulting amplitude of said interfering signal in said modified mismatch signal;

(g) providing from said AIC processor to said modifier means an amplitude control signal having a value to provide said modified interference sensor signal with an amplitude equal to said established value minus the minimum measured amplitude of said interfering signal measured in step (e) and measuring the resulting amplitude of said interfering signal in said modified mismatch signal; and (h) selecting as a new established amplitude control signal value the value in step (f) or step (g), whichever resulted in the smaller measured interfering signal in said modified mismatch signal and returning to step (d).

* * * * *